(12) United States Patent
Luh et al.

(10) Patent No.: US 7,034,728 B2
(45) Date of Patent: Apr. 25, 2006

(54) BANDPASS DELTA-SIGMA MODULATOR WITH DISTRIBUTED FEEDFORWARD PATHS

(75) Inventors: Louis Luh, San Gabriel, CA (US); Todd S. Kaplan, Los Angeles, CA (US)

(73) Assignee: Raytheon Company, Waltham, MA (US)

( * ) Notice: Subject to any disclaimer, the term of this patent is extended or adjusted under 35 U.S.C. 154(b) by 0 days.

(21) Appl. No.: 10/915,775

(22) Filed: Aug. 11, 2004

(65) Prior Publication Data

US 2006/0038708 A1    Feb. 23, 2006

(51) Int. Cl.
H03M 3/00      (2006.01)
H04B 14/06     (2006.01)
G06F 17/10     (2006.01)

(52) U.S. Cl. ............ 341/143; 375/247; 708/307
(58) Field of Classification Search ........ 341/143, 341/76, 133, 118, 120, 155, 156, 161, 139; 708/313, 307; 375/244, 247
See application file for complete search history.

(56) References Cited

U.S. PATENT DOCUMENTS

| | | | | |
|---|---|---|---|---|
| 5,012,244 A | * | 4/1991 | Wellard et al. | 341/143 |
| 5,196,850 A | * | 3/1993 | Duffy et al. | 341/76 |
| 5,283,578 A | * | 2/1994 | Ribner et al. | 341/143 |
| 5,357,252 A | * | 10/1994 | Ledzius et al. | 341/143 |
| 5,414,424 A | * | 5/1995 | Cabler | 341/143 |
| 5,446,460 A | * | 8/1995 | Cabler | 341/143 |
| 5,500,645 A | * | 3/1996 | Ribner et al. | 341/143 |
| 5,585,801 A | * | 12/1996 | Thurston | 341/143 |
| 5,629,701 A | * | 5/1997 | Ritoniemi et al. | 341/143 |
| 5,729,230 A | * | 3/1998 | Jensen et al. | 341/143 |
| 5,732,002 A | * | 3/1998 | Lee et al. | 708/313 |
| 6,157,329 A | * | 12/2000 | Lee et al. | 341/133 |
| 6,157,331 A | * | 12/2000 | Liu et al. | 341/143 |
| 6,225,928 B1 | * | 5/2001 | Green | 341/143 |
| 6,249,236 B1 | * | 6/2001 | Lee et al. | 341/143 |
| 6,396,428 B1 | * | 5/2002 | Cheng | 341/143 |
| 6,483,449 B1 | * | 11/2002 | Gandolfi et al. | 341/143 |
| 6,515,604 B1 | * | 2/2003 | Delano | 341/143 |
| 6,693,571 B1 | * | 2/2004 | Melanson et al. | 341/143 |
| 6,697,000 B1 | * | 2/2004 | LeReverend et al. | 341/143 |
| 6,768,435 B1 | * | 7/2004 | Xu | 341/143 |
| 6,822,592 B1 | * | 11/2004 | Gandolfi et al. | 341/143 |
| 6,911,928 B1 | * | 6/2005 | Orsier et al. | 341/143 |
| 6,943,715 B1 | * | 9/2005 | Radja et al. | 341/143 |

* cited by examiner

Primary Examiner—Patrick Wamsley
(74) Attorney, Agent, or Firm—Leonard A. Alkov; Karl A. Vick

(57) ABSTRACT

A delta-sigma modulator. The novel delta-sigma modulator includes one or more filter stages arranged in cascade, wherein each filter stage includes a first circuit for generating a first output signal and second circuit for generating a second output signal; and a summing circuit for adding the first and second output signals from each of the filter stages. In an illustrative embodiment, the first circuit is a bandpass filter including an inductive-capacitive resonator and the second circuit is an integrator, which generates a second output signal that is orthogonal to the first output signal. The output of the summing circuit is digitized and then converted back to analog to provide a feedback signal. The feedback signal is subtracted from an input signal, and the resultant difference signal is input to a first filter stage.

26 Claims, 4 Drawing Sheets

BANDPASS DELTA-SIGMA MODULATOR WITH DISTRIBUTED FEEDFORWARD PATHS

BACKGROUND OF THE INVENTION

1. Field of the Invention

The present invention relates to electronics and electrical systems. More specifically, the present invention relates to delta-sigma modulators.

2. Description of the Related Art

Analog to digital converters are widely used for converting analog signals to corresponding digital signals for many electronic circuits. For example, a high resolution analog to digital converter (ADC) may find application in radar, missile, and communications systems. There are two basic techniques for performing analog to digital conversion: an open-loop technique and a feedback technique. An open-loop ADC generates a digital signal directly in response to an analog input signal. This approach uses precisely matched components to digitize the input signal. The resolution and accuracy of the open-loop ADC depend on the matching of these components. However, highly precise components are difficult to achieve in conventional integrated circuit processing.

A delta-sigma (ΔΣ) ADC (also known as a sigma-delta ADC) is a feedback type of ADC that subtracts a feedback signal from the analog input signal to provide an error signal, which is filtered and then quantized to form a digital output signal. The delta-sigma approach achieves high resolution by precise timing instead of by precisely matched components (such as resistors and capacitors) that are required in open-loop converters. The delta-sigma technique is therefore the preferred technique for many applications.

A delta-sigma ADC typically includes a delta-sigma modulator and a decimator. The delta-sigma modulator (also known as a sigma-delta modulator) uses oversampling (having a sampling rate above the Nyquist rate) and filtering to develop a high signal-to-noise ratio in the signal band. The decimator then resamples the output of the modulator and provides an N-bit data word at the Nyquist rate.

A simple delta-sigma modulator includes a quantizer a filter; and a digital to analog converter (DAC). The quantizer generates a digital output signal in response to filtered difference between the analog input signal and a feedback signal. The feedback signal is the digital output signal reconverted to analog by the DAC. The filter shapes the quantization noise to frequencies outside of the signal band. Thus, the delta-sigma converter is referred to as a noise-shaping ADC. The decimator typically includes a filter having a lowpass (or bandpass) characteristic with a cutoff frequency at (or within a bandwidth of) the Nyquist frequency. Since the sampling frequency is much higher than the Nyquist frequency, the filter can usually attenuate this out-of-band quantization noise sufficiently.

Delta-sigma ADCs were originally developed for digitizing baseband (low pass) signals, such as audio signals. Since delta-sigma ADCs typically operate at clock frequencies below 100 MHz, and a large oversampling ratio (i.e., the sampling rate to the Nyquist rate) is required to obtain high resolution, sigma-delta ADCs have traditionally been employed to digitize analog signals below 1 MHz. Bandpass delta-sigma modulators are a relatively new idea intended to apply delta-sigma techniques to intermediate frequency (IF) signals. A bandpass delta-sigma modulator is designed to suppress quantization noise over a narrow band of frequencies centered at an intermediate frequency (from about 1 MHz to 2 GHz).

Delta-sigma modulators are difficult to implement at high frequencies using active components. Passive inductive-capacitive (LC) resonators have therefore been used to implement bandpass delta-sigma modulators. Conventional LC bandpass delta-sigma modulators, however, require multiple feedback paths having different delays. This approach causes large voltage swings in the loop filters and leads to higher distortion and less dynamic range. In addition, all the analog components and the feedback DACs need to have very low distortion and low noise, resulting in increased circuit complexity.

Hence, a need exists in the art for an improved bandpass delta-sigma modulator that offers higher resolution, better linearity, and less circuit complexity than conventional bandpass delta-sigma modulators.

SUMMARY OF THE INVENTION

The need in the art is addressed by the delta-sigma modulator of the present invention. The novel delta-sigma modulator includes one or more filter stages arranged in cascade, wherein each filter stage includes a first circuit for generating a first output signal and second circuit for generating a second output signal; and a summing circuit for adding the first and second output signals from each of the filter stages. In an illustrative embodiment, the first circuit is a bandpass filter including an inductive-capacitive resonator and the second circuit is an integrator, which generates a second output signal that is (transfer function mathematically) orthogonal to the first output signal. The first and second output signals of every filter stage are each passed through a gain amplifier and fed forward to the summing circuit. The output of the summing circuit is digitized and then converted back to analog to provide a single feedback signal. The feedback signal is subtracted from the analog input signal, and the resultant difference signal is input to a first filter stage. Additional filter stages are adapted to receive as an input either the first output signal or the second output signal generated by a previous filter stage.

DESCRIPTION OF THE INVENTION

Illustrative embodiments and exemplary applications will now be described with reference to the accompanying drawings to disclose the advantageous teachings of the present invention.

While the present invention is described herein with reference to illustrative embodiments for particular applications, it should be understood that the invention is not limited thereto. Those having ordinary skill in the art and access to the teachings provided herein will recognize additional modifications, applications, and embodiments within the scope thereof and additional fields in which the present invention would be of significant utility.

Figure 1:
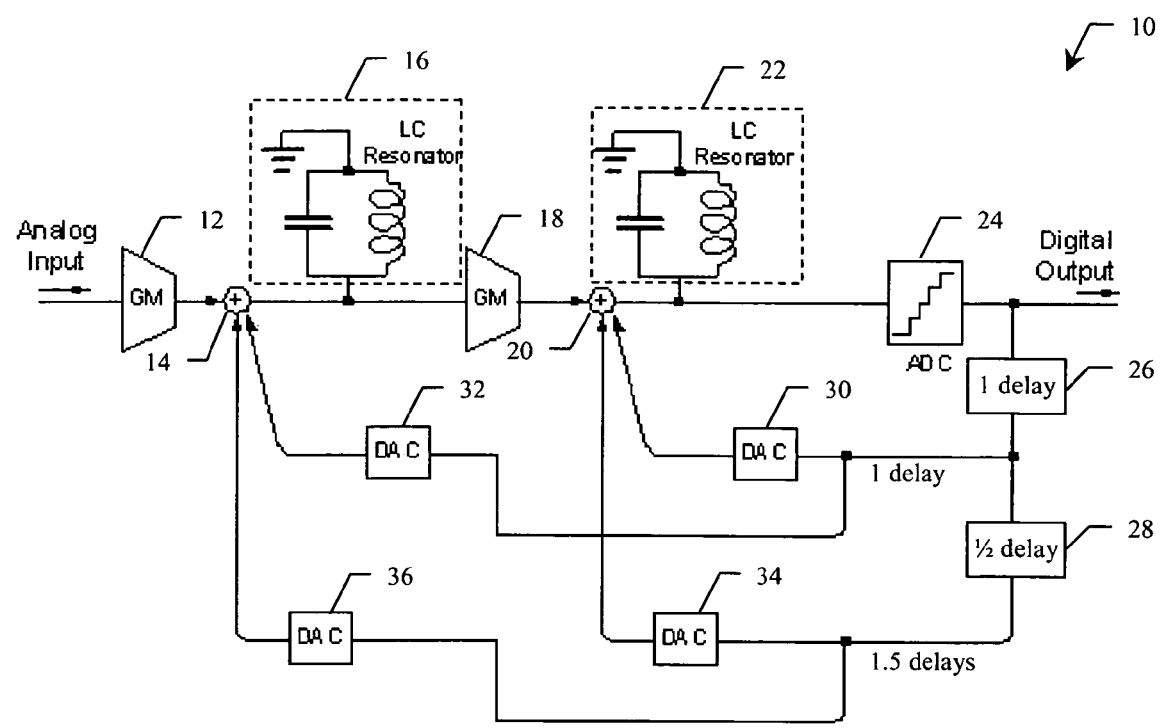
FIG. 1 is a simplified schematic of a conventional fourth-order LC bandpass delta-sigma modulator.

FIG. 1 is a simplified schematic of a conventional fourth-order LC bandpass delta-sigma modulator 10. An analog input signal is applied to a transconductance ($G_m$) amplifier 12, which converts the input voltage to a current. A summing node 14 sums the output of the $G_m$-cell 12 with the outputs from a first current DAC 32 and a second current DAC 36, to provide a driving current for a first LC resonator 16. The resonator 16 works as a band pass filter to the input signal and a bandstop filter to the quantization noise. The resonator 16 is designed so that the filter's stop band coincides with the signal spectrum. Thus, the resonator 16 shapes the quantization noise spectrum so that most of the noise occurs at frequencies outside the signal spectrum.

Because this is a fourth-order modulator, the circuit 10 also includes a second filter stage comprising a second $G_m$ amplifier 18 and a second LC resonator 22. The $G_m$ amplifier 18 converts the voltage output of the first resonator 16 to a current, which is added at a summing node 20 to the outputs of a third current DAC 30 and a fourth current DAC 34. The resultant current drives the second resonator 22, the output of which is digitized by a quantizer 24. The digital output of the quantizer 24 is fed back to the DACs 30 and 32 after a full delay 26, and to the DACs 34 and 36 after an additional half delay 28 (total delay of 1.5). The feedback gains of the DACs 30, 32, 34, and 36 can be tuned to achieve the desired noise-shaping transfer function.

As discussed above, the conventional LC bandpass delta-sigma modulator 10 suffers from high distortion and low dynamic range due to the multiple feedback paths and different delays. In addition, all of the feedback DACs 30, 32, 34, and 36 need to be high performance devices, resulting in a more complicated circuit and higher power dissipation.

The need for multiple feedback paths and different delays is eliminated by the delta-sigma modulator of the present invention. The novel architecture includes the addition of a number of integrators in the loop filter, enabling a passive LC bandpass delta-sigma modulator to be implemented using distributed feedforward paths and only one feedback path.

Figure 2:
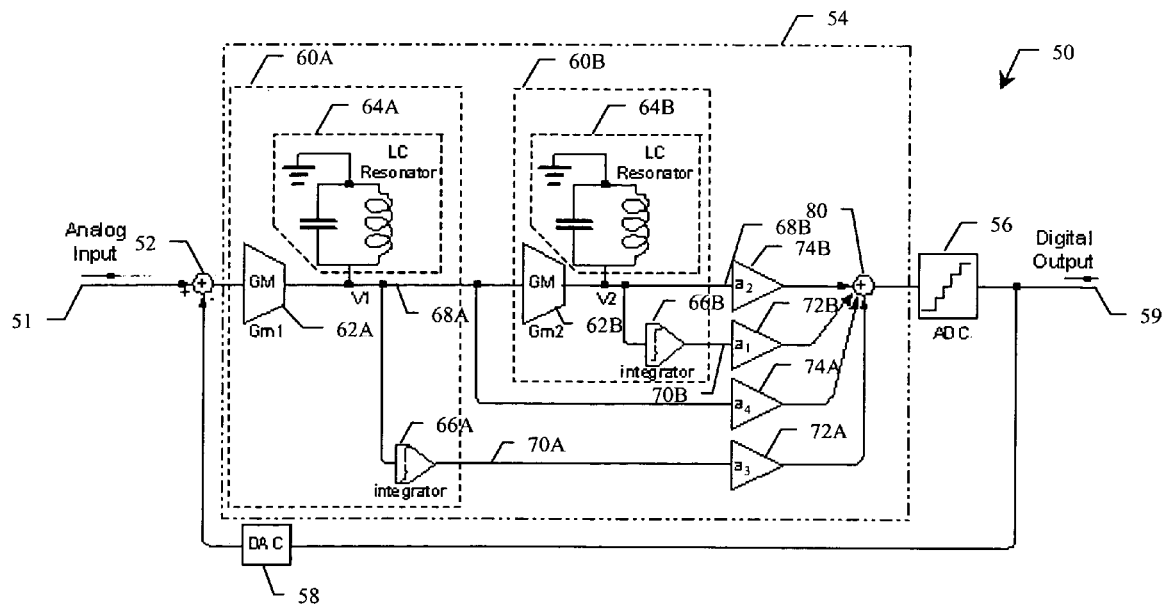
FIG. 2 is a simplified schematic of an illustrative embodiment of a fourth-order LC bandpass delta-sigma modulator designed in accordance with the teachings of the present invention

FIG. 2 is a simplified schematic of an illustrative embodiment of a fourth-order LC bandpass delta-sigma modulator 50 designed in accordance with the teachings of the present invention. The delta-sigma modulator 50 includes a summing node 52, which generates a difference signal by subtracting a feedback signal generated by a DAC 58 from an analog input signal applied to an input terminal 51. The resultant difference signal is applied to a loop filter 54, and the output of the filter 54 is digitized by a quantizer or ADC 56. The digital output of the ADC 56 is coupled to an output terminal 59 and to the input of the DAC 58.

The filter 54 of the fourth-order modulator 50 includes two stages 60A and 60B. The first stage 60A includes a $G_m$-cell 62A adapted to convert the output of the summing node 52 to a current for bandpass filtering by a passive LC resonator 64A. The output voltage V1 of the resonator 64A provides a first output signal 68A, which is coupled to an integrator 66A and to the input of the second filter stage 60B. The integrator 66A generates a second output signal 70A, which is orthogonal (that is, mathematically orthogonal such that a desired transfer function can be realized) to the first output signal 68A.

Similarly, the second filter stage 60B includes a $G_m$-cell 62B adapted to convert the resonator output 68A from the first filter stage 60A to a current for a second bandpass filtering by a second passive LC resonator 64B. The output voltage V2 of the resonator 64B provides a third output signal 68B, which is coupled to an integrator 66B. The integrator 66B generates a fourth output signal 70B, which is orthogonal to the third output signal 68B output by the resonator 64B.

The resonator outputs 68A and 68B are also coupled to amplifiers 74A and 74B, respectively, having gains $a_4$ and $a_2$, respectively. The integrator outputs 70A and 70B are coupled to amplifiers 72A and 72B, respectively, having gains $a_3$ and $a_1$, respectively. The different gains ($a_1$ to $a_4$) serve as the coefficients of the feedforward paths. The outputs of these amplifiers 72A, 74A, 72B, and 74B are summed at a summing node 80 and fed to the ADC 56. The output of the ADC 56 is the digital output of the modulator 50 and is also fed back through the DAC 58.

Four feedforward paths are needed in a fourth-order modulator in order to stabilize the system. The addition of the integrators 66A and 66B provides the extra outputs needed from each filter section to realize a fourth-order transfer function. One of ordinary skill in the art would be able to determine the optimum values of the gain coefficients ($a_1$ to $a_4$) based on the desired transfer function of the filter 54.

Figure 3:
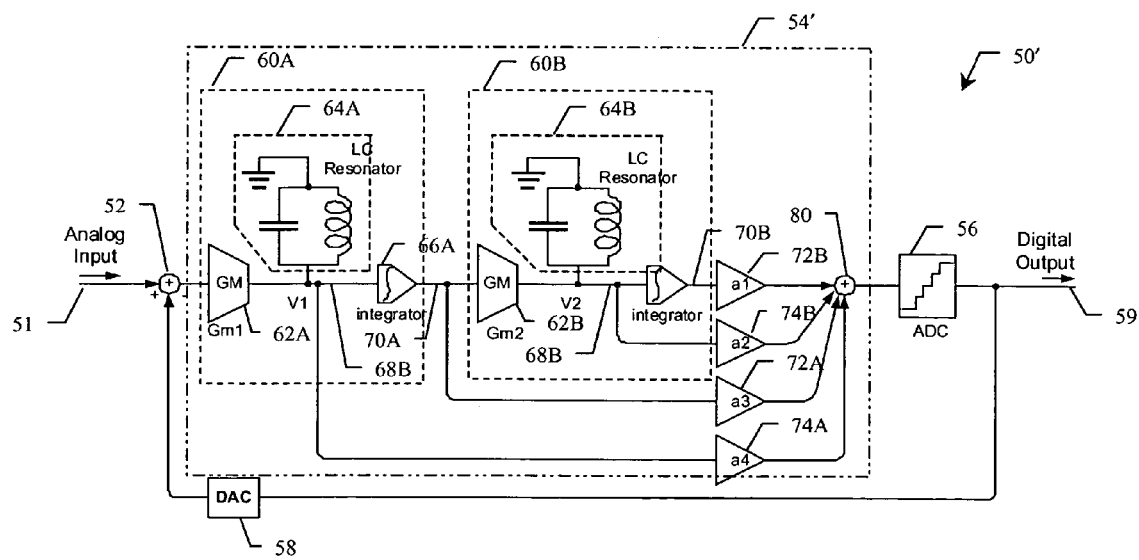
FIG. 3 is a simplified schematic of an alternate embodiment of a fourth-order LC bandpass delta-sigma modulator designed in accordance with the teachings of the present invention.

FIG. 3 is a simplified schematic of an alternate embodiment of a fourth-order LC bandpass delta-sigma modulator 50' designed in accordance with the teachings of the present invention. This circuit 50' is identical to that of FIG. 2, except that the integrator output 70A from the first filter stage 60A is input to the second filter stage 60B instead of the resonator output 68A. This architecture has the special advantage that the values of the feedforward coefficients ($a_1$ to $a_4$) are the same as (or similar to) a $G_m$-C type bandpass delta-sigma modulator. This makes it easier to convert an active bandpass delta-sigma modulator design to a passive LC delta-sigma modulator.

The architectures shown in these examples are single-ended for simplicity. These architectures can also be implemented differentially by simply changing all the components to differential-mode circuits. Furthermore, the embodiments shown in FIGS. 2–3 are fourth-order modulators, but the invention is not limited thereto. Higher or lower order modulators may be implemented without departing from the scope of the present teachings.

Figure 4:
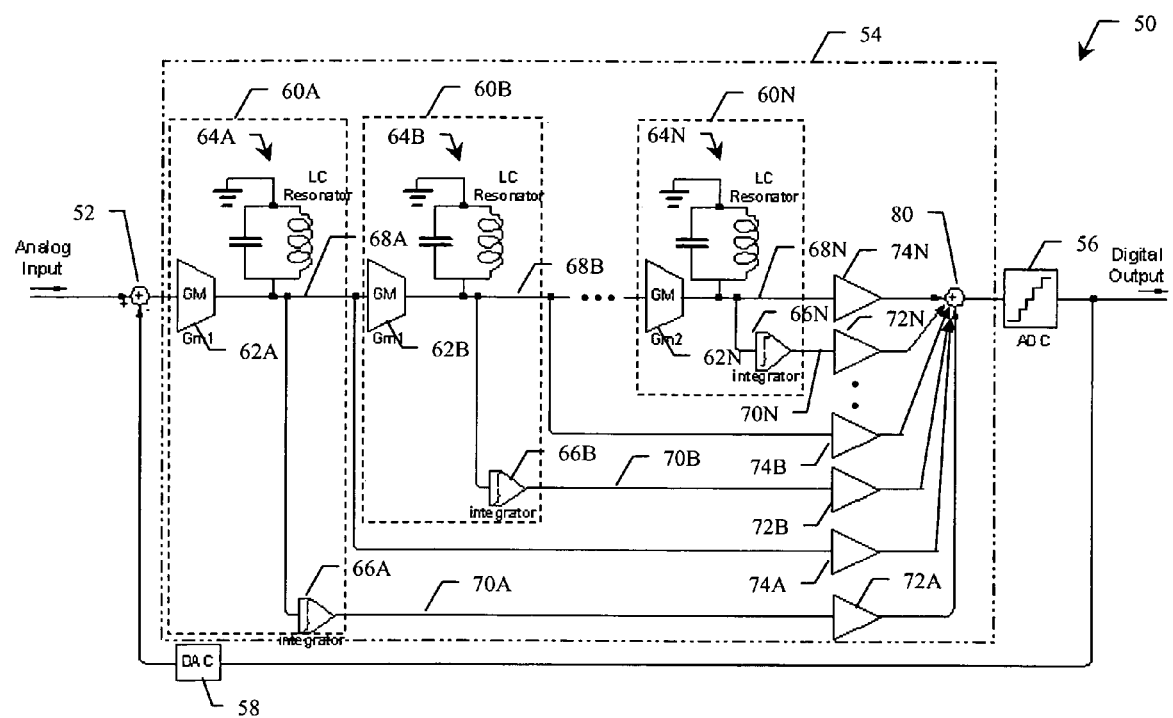
FIG. 4 is a simplified schematic of an illustrative embodiment of an n-th order LC bandpass delta-sigma modulator designed in accordance with the teachings of the present invention.
Figure 5:
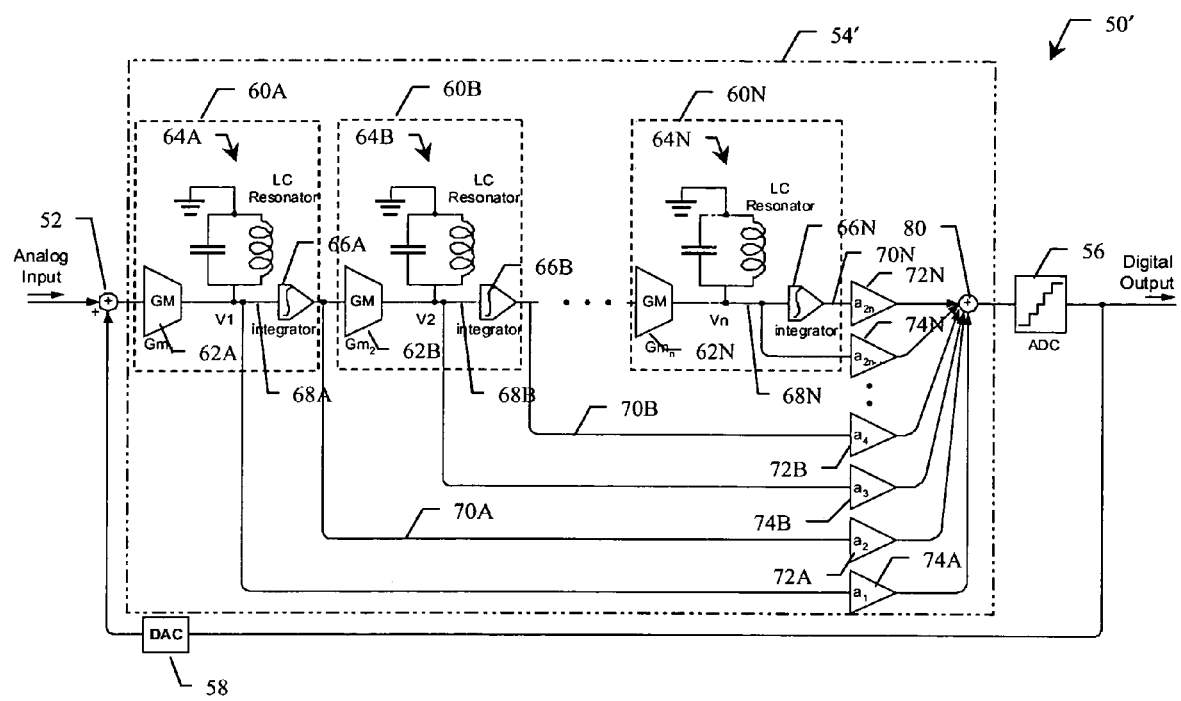
FIG. 5 is a simplified schematic of an alternate embodiment of an n-th order LC bandpass delta-sigma modulator designed in accordance with the teachings of the present invention.

FIG. 4 is a simplified schematic of an illustrative embodiment of an n-th order LC bandpass delta-sigma modulator 50 designed in accordance with the teachings of the present invention, and FIG. 5 is a simplified schematic of an alternate embodiment of an n-th order LC bandpass delta-sigma modulator 50' designed in accordance with the teachings of the present invention.

The delta-sigma modulator 50 includes a summing node 52 adapted to generate a difference signal from an input signal and a feedback signal, a filter 54 that operates on the difference signal, an ADC 56 that digitizes the output of the filter 54, and a DAC 58 that generates the feedback signal by converting the digital output of the ADC 56 back to analog. In general, the filter 54 is comprised of one or more filter stages 60 (labeled 60A, 60B, ..., 60N) arranged in cascade, with an output from a filter stage applied as an input to the next filter stage (the difference signal from the summing node 52 is the input to the first filter stage 60A). The number of filter stages 60 depends on the order of the modulator. An n-th order modulator will have n/2 filter stages. Each filter stage 60 is designed to generate two output signals. Each output signal is passed through a gain amplifier 72 and 74, respectively (labeled 72A to 72N and 74A to 74N for each of the filter stages 60A to 60N). All of the amplified output signals from all of the filter stages are then summed by a summing node 80, the output of which is fed to the ADC 56.

Each filter stage 60 includes a bandpass filter, which in these embodiments is implemented using a transconductance amplifier 62 and an LC resonator 64. Other types of resonators or bandpass filters can also be used without departing from the scope of the present teachings. The output of the resonator 64 is passed through an integrator 66. Each filter stage 60 provides two output signals: the output 68 of the resonator 64 and the output 70 of the integrator 66. (Reference numbers for these components in FIGS. 4–5 are followed by a letter corresponding to the filter stage, i.e. components in the first filter stage 60A are referenced with the letter A and components in the n-th filter stage 60N are referenced with the letter N.)

Either of the output signals 68 or 70 can be applied to the input of the next filter stage 60. In the embodiment of FIG. 4, the resonator output 68 is applied as the input to the next filter stage 60. In the embodiment of FIG. 5, the integrator output 70 is used as the input to the next filter stage 60. In addition, the filter stage inputs can be of mixed types, meaning some of the filter stages can use the resonator output 68 from the previous stage as an input, while other filter stages can use the integrator output 70 from the previous stage as an input. This allows for more flexibility in the modulator design.

An advantage of the FIG. 5 type of embodiment, where the integrator outputs 70 are used as the inputs to the filter stages 60, is that the feedforward coefficients are similar to a $G_m$-C type modulator. This makes the design conversion from active modulator to passive LC modulator much easier. However, this type of placement requires all the integrators 66 to have better performance. On the other hand, the embodiment of FIG. 4, where the resonator outputs 68 are used as the inputs to the filter stages 60, allows low performance integrators to be used. This will simplify the circuit design and complexity.

Thus, the delta-sigma modulator of the present invention increases dynamic range and reduces distortion by eliminating the multiple feedback paths and different delays required in a conventional bandpass delta-sigma modulator. In addition, the present teachings allow the implementation of a delta-sigma modulator with more relaxed analog circuit requirements and very good stability, which will reduce circuit complexity and design time. With only one feedback DAC in the modulator, only this one DAC is required to have high performance. This minimizes the circuit complexity and the routing complexity of the layout.

Thus, the present invention has been described herein with reference to a particular embodiment for a particular application. Those having ordinary skill in the art and access to the present teachings will recognize additional modifications, applications and embodiments within the scope thereof. For example, while the present invention has been described with reference to an ADC application, the invention is not limited thereto. The novel delta-sigma modulator can also be used in other applications such as DACs, signal detectors, and pulse code modulators without departing from the scope of the present teachings.

It is therefore intended by the appended claims to cover any and all such applications, modifications and embodiments within the scope of the present invention.

Accordingly,

What is claimed is:

1. A delta-sigma modulator comprising:
   one or more filter stages arranged in cascade, wherein each filter stage includes first means for generating a first output signal and second means for generating a second output signal, wherein said second means is adapted to generate said second output signal that is orthogonal to said first output signal; and
   third means for adding said first and second output signals from each of said filter stages.

2. The invention of claim 1 wherein said first means includes a bandpass filter.

3. The invention of claim 2 wherein said bandpass filter includes an inductive-capacitive resonator.

4. The invention of claim 3 wherein said bandpass filter further includes a transconductance amplifier for generating a current to drive said resonator.

5. The invention of claim 1 wherein said second means includes an integrator.

6. The invention of claim 5 wherein said first output signal is applied as an input to said integrator.

7. The invention of claim 1 wherein said first output signal or said second output signal generated by a filter stage is applied as an input to a subsequent filter stage.

8. A delta-sigma modulator comprising:
   one or more filter stages arranged in cascade, wherein each filter stage includes first means for generating a first output signal and second means for generating a second output signal;
   third means for adding said first and second output signals from each of said filter stages; and
   fourth means for applying a gain to each of said output signals.

9. The invention of claim 8 wherein said fourth means includes a plurality of gain amplifiers.

10. The invention of claim 9 wherein each output signal is applied as an input to a gain amplifier.

11. The invention of claim 10 wherein said third means includes a summing node adapted to sum the outputs of said gain amplifiers.

12. The invention of claim 11 wherein said modulator further includes means for digitizing the output of said summing node to generate a digital output signal.

13. The invention of claim 12 wherein said modulator further includes means for converting said digital output signal to analog to generate a feedback signal.

14. The invention of claim 13 wherein said modulator further includes means for subtracting said feedback signal from an input signal to generate a difference signal.

15. The invention of claim 14 wherein said difference signal is applied as an input to a first filter stage.

16. The invention of claim 8 wherein said first means includes a bandpass filter.

17. The invention of claim 16 wherein said bandpass filter includes an inductive-capacitive resonator.

18. The invention of claim 17 wherein said bandpass filter futher includes a transconductance amplifier for generating a current to drive said resonator.

19. The invention of claim 8 wherein said second means is adapted to generate a second output signal that is orthogonal to said first output signal.

20. The invention of claim 19 wherein said second means includes an integrator.

21. The invention of claim 20 wherein said first output singla is applied as an input to said integrator.

22. The invention of claim 8 wherein said first output signal or said second output signal generated by a filter stage is applied as an input to a subsequent filter stage.

23. A delta-sigma modulator comprising:
a first summing circuit for generating a difference signal from an input signal and a feedback signal;
one or more filter stages arranged in cascade, wherein each filter stage includes a bandpass filter adapted to generate a first output signal and an integrator adapted to operate on said first output signal to generate a second output signal, and wherein a first filter stage is adapted to receive said difference signal as an input and subsequent filter stages are adapted to receive as an input either said first output signal or said second output signal generated by a previous filter stage;
a second summing circuit adapted to add said first and second output signals from each of said filter stages;
an analog to digital converter adapted to convert the output of said second summing circuit to a digital signal; and
and a digital to analog converter adapted to convert said digital signal to analog to generate said feedback signal.

24. The invention of claim 23 wherein said bandpass filter includes an inductive-capacitive resonator.

25. The invention of claim 23 wherein said modulator further includes a plurality of gain amplifiers, each amplifier adapted to apply a gain to one of said output signals before being summed by said second summing circuit.

26. A method for digitizing an analog input signal including the steps of:
generating a difference signal from said input signal and a feedback signal;
passing said difference signal through one or more filter stages arranged in cascade, wherein each filter stage includes a bandpass filter adapted to generate a first output signal and an integrator adapted to operate on said first output signal to generate a second output signal;
feeding each of said first and second output signals forward to a summing circuit;
adding together all of said first and second output signals to generate a third output signal;
quantizing said third output signal to generate a digital output; and
converting said digital output to analog to generate said feedback signal.

* * * * *